United States Patent
Kim

(10) Patent No.: US 12,422,742 B2
(45) Date of Patent: Sep. 23, 2025

(54) METHOD OF MANUFACTURING DEPOSITION MASK FRAME ASSEMBLY FOR DISPLAY PANEL

(71) Applicant: Keeps Biopharma Inc., Hwaseong-si (KR)

(72) Inventor: Jung Ho Kim, Yongin-si (KR)

(73) Assignee: KEEPS BIOPHARMA INC., Hwaseong-si (KR)

( * ) Notice: Subject to any disclaimer, the term of this patent is extended or adjusted under 35 U.S.C. 154(b) by 378 days.

(21) Appl. No.: 17/864,148

(22) Filed: Jul. 13, 2022

(65) Prior Publication Data

US 2023/0062020 A1 Mar. 2, 2023

(30) Foreign Application Priority Data

Aug. 25, 2021 (KR) .................. 10-2021-0112624

(51) Int. Cl.
*G03F 1/68* (2012.01)
*B05C 21/00* (2006.01)
*G03F 1/66* (2012.01)
*H10K 71/00* (2023.01)
*H10K 71/16* (2023.01)

(52) U.S. Cl.
CPC .............. *G03F 1/68* (2013.01); *B05C 21/005* (2013.01); *G03F 1/66* (2013.01); *H10K 71/00* (2023.02); *H10K 71/166* (2023.02)

(58) Field of Classification Search
None
See application file for complete search history.

(56) References Cited

U.S. PATENT DOCUMENTS

| | | | | |
|---|---|---|---|---|
| 8,343,278 B2* | 1/2013 | Sung | .................... | H10K 71/166 |
| | | | | 118/721 |
| 8,646,406 B2* | 2/2014 | Ahn | ......................... | G03F 1/20 |
| | | | | 118/301 |
| 9,039,478 B2* | 5/2015 | Kim | ......................... | G03F 1/22 |
| | | | | 219/136 |
| 9,567,662 B2* | 2/2017 | Kim | ..................... | H10K 71/166 |
| 10,014,471 B2* | 7/2018 | Baek | ..................... | C23C 16/042 |
| 10,286,416 B2* | 5/2019 | Han | ..................... | B23K 26/244 |
| 10,868,268 B2* | 12/2020 | Kim | ..................... | H10K 50/805 |
| 10,873,028 B2* | 12/2020 | Kim | ..................... | C23C 14/042 |
| 11,279,999 B2* | 3/2022 | Aoki | ..................... | H10K 71/164 |
| 11,434,559 B2* | 9/2022 | Aoki | ..................... | B05C 21/005 |

(Continued)

FOREIGN PATENT DOCUMENTS

| | | |
|---|---|---|
| KR | 10-2083947 | 4/2020 |
| KR | 10-2130546 | 7/2020 |

(Continued)

*Primary Examiner* — Jethro M. Pence
(74) *Attorney, Agent, or Firm* — KILE PARK REED & HOUTTEMAN PLLC

(57) ABSTRACT

Provided is a method of manufacturing a deposition mask frame assembly, the method including placing and welding a support stick mask and a gap stick mask on a frame, and joining edges of a deposition stick mask with the frame by welding while the deposition stick mask is tensioned in a longitudinal direction of the X-axis direction and at the same time, adhesively tensioned in the Y-axis direction, thereby preventing wrinkles due to the tensioning of the deposition stick mask to manufacture a fine and high-quality deposition mask frame assembly.

6 Claims, 13 Drawing Sheets

(56) References Cited

U.S. PATENT DOCUMENTS

| | | | | |
|---|---|---|---|---|
| 11,608,554 B2* | 3/2023 | Aoki | ............... | H10K 71/164 |
| 11,788,181 B2* | 10/2023 | Aoki | ............... | C23C 14/24 |
| | | | | 118/504 |
| 11,937,492 B2* | 3/2024 | Lee | ............... | G03F 7/0015 |
| 2014/0137798 A1* | 5/2014 | Ahn | ............... | C23C 16/042 |
| | | | | 118/504 |
| 2015/0101536 A1* | 4/2015 | Han | ............... | C23C 14/042 |
| | | | | 118/721 |
| 2016/0079568 A1* | 3/2016 | Han | ............... | H10K 71/00 |
| | | | | 438/34 |
| 2020/0123644 A1* | 4/2020 | Lee | ............... | H10K 71/164 |
| 2020/0238328 A1* | 7/2020 | Lee | ............... | B05C 21/005 |
| 2020/0259126 A1* | 8/2020 | Moon | ............... | C23C 14/042 |
| 2021/0249603 A1* | 8/2021 | Kim | ............... | H10K 71/164 |
| 2023/0058121 A1* | 2/2023 | Moon | ............... | C23C 14/042 |
| 2023/0227961 A1* | 7/2023 | Hong | ............... | H10K 71/166 |
| | | | | 118/504 |
| 2023/0240124 A1* | 7/2023 | Kim | ............... | H10K 71/166 |
| 2023/0416901 A1* | 12/2023 | Jeong | ............... | H10K 50/00 |
| 2024/0076772 A1* | 3/2024 | Kim | ............... | C23C 14/042 |
| 2024/0295019 A1* | 9/2024 | Ha | ............... | C23C 14/042 |
| 2024/0318293 A1* | 9/2024 | Hong | ............... | C23C 14/042 |

FOREIGN PATENT DOCUMENTS

| | | |
|---|---|---|
| KR | 10-2193044 | 12/2020 |
| KR | 10-2021-0003996 | 1/2021 |

* cited by examiner

METHOD OF MANUFACTURING DEPOSITION MASK FRAME ASSEMBLY FOR DISPLAY PANEL

CROSS-REFERENCE TO RELATED APPLICATION

This application claims priority to and the benefit of Korean Patent Application No. 10-2021-0112624 under 35 U.S.C. § 119, filed on Aug. 25, 2021 in the Korean Intellectual Property Office (KIPO), the entire contents of which are incorporated herein by reference.

BACKGROUND

1. Field of the Invention

The disclosure relates to a method of manufacturing a deposition mask frame assembly for a display panel, and more particularly, to a technique of manufacturing a mask frame assembly by tensioning and welding a mask.

2. Discussion of Related Art

Among display devices, an organic light-emitting diode (OLED) display panel using an OLED has a wide viewing angle, high contrast, and a high response rate. Therefore, fields in which an OLED is used are increasing continuously.

Intermediate layers, such as electrodes and an emission layer, of an OLED may be formed by various methods, and one of the various methods is a deposition method.

To manufacture a small- or medium-sized OLED display panel, a process of depositing organic and inorganic materials is performed to form RGB pixels during the manufacture of an OLED. For example, a thin film of a desired pattern is formed by aligning a fine metal mask (FMM) having the same pattern as a pattern of a thin film to be formed or the like on thin-film transistor (TFT) glass and depositing a source material of the thin film. In the deposition process, an organic material is heated in a deposition source disposed at lower part of a chamber to sublimate and deposit the organic material on the TFT glass through a mask on disposed at upper part of the chamber.

The FMM has a stick shape and thus may be also called a deposition stick mask. In general, a deposition mask frame assembly may be manufactured by simultaneously tensioning an end of a deposition stick mask and an another end thereof and welding the deposition stick mask on a mask frame by laser.

A deposition stick mask has been widely used to manufacture a deposition mask frame assembly because mass production of display panels may be enabled using the deposition stick mask, and relatively small display panels such as a smart phone have been produced using the deposition mask frame assembly. However, recently, there is a need to develop a stick mask frame assembly applicable to medium or large display panels such as a tablet personal computer (PC) or a laptop computer.

FIG. 1A is a schematic view of an upper surface of a deposition stick mask, and FIG. 1B is a schematic cross-sectional view taken along line A-A' of FIG. 1A.

As shown in FIG. 1A, a deposition stick mask 100, which is commonly called a fine metal mask (FMM), includes a structural stick mask 110 and cell unit masks 120, and extends in a longitudinal direction.

The structural stick mask 110 includes edges 111 and ribs 112, and the cell unit masks 120 may be provided with deposition pattern holes P. There may be several cell unit masks on one structural stick mask 110. Hundreds of thousands to millions of deposition pattern holes P may be formed in one cell unit mask. Skirts 113 may be symmetrically provided on an end of each of the edges 111 and an another end thereof to function as gripping regions. A skirt may be gripped and easily tensioned (as indicated by Tx) by a gripper (not shown) in the longitudinal direction of an X-axis direction. One gripper may be disposed to grip one skirt, and when eight skirts are provided as shown in FIG. 1A, the eight skirts may be tensioned by eight grippers at the same time.

The structural stick mask 110 may have a thickness of 100 μm to 200 μm, a length of 1 m or more, and a width of several tens of cm, and the cell unit mask 120 may have a thickness of 10 μm to 20 μm. The cell unit mask 120 and the structure stick mask 110 may be seamlessly and integrally formed or may be manufactured separately and combined with each other by welding, thus causing seams.

The structural stick mask 110 further includes the ribs 112, and the ribs 112 should be understood to mean regions located between cell unit masks 120 and provided with no deposition pattern holes.

However, when a large deposition stick mask is tensioned by a large number of grippers at the same time, a tensile force may not be uniformly applied to the deposition stick mask, thus causing wrinkles and causing the deposition stick mask to contract in the Y-axis direction (indicated by an arrow). For example, when four skirts are provided on an end of the edge 111 and gripped by four grippers, three wrinkles W1, W2, and W3 may be generated as shown in FIG. 1B. A contraction force of an intermediate region of the deposition stick mask may be higher than that of an end region thereof and thus a size and depth of the wrinkles of the intermediate region may be greater those of the end region.

In addition, as a size of the deposition stick mask is increased, a size and weight of ribs may increase in the Y-axis direction, thus causing the ribs to sag due to gravity.

As shown in FIG. 1B, as the deposition stick mask contracts in the Y-axis direction (indicated by the arrow) and the three wrinkles W1, W2, and W3 may be generated, a shadow effect increases, thus degrading the quality of the deposition mask frame assembly.

Furthermore, as the size of the deposition stick mask increases, the number of grippers that perform tensioning increase, the number of wrinkles may increase, thus exacerbating quality degradation.

Korean Laid-Open Patent Publication (registered publication No. 10-2193044, titled "System and Method for Manufacturing Metal Mask") discloses a technique of fixing a mask integrated into one on a mask frame while two or more edges of the mask are tensioned by clampers but does not disclose a method of performing adhesive tensioning in a Y-axis direction to prevent wrinkles of a stick type mask.

SUMMARY

The disclosure relates to a method of manufacturing a deposition mask frame assembly, and a method of manufacturing a fine and high-quality deposition mask frame assembly by preventing wrinkles tensioning of a medium- or large-sized deposition mask.

According to an aspect, a method of manufacturing a deposition mask frame assembly using a deposition stick mask that includes a structural stick mask with edges and ribs and cell unit masks with deposition pattern holes may include: preparing a frame having a quadrangular shape with a central opening; placing and welding a support stick mask on a frame while the support stick mask is tensioned in a longitudinal direction of a Y-axis direction; placing and welding a gap stick mask on the frame while the gap stick mask is tensioned in a longitudinal direction of an X-axis direction; and placing a deposition stick mask on the frame, and welding the edges on the frame while the deposition stick mask is tensioned in a longitudinal direction of the X-axis direction and at the same time, adhesively tensioned in the Y-axis direction, thereby preventing wrinkles due to tension to manufacture a fine and high-quality deposition mask frame assembly.

BRIEF DESCRIPTION OF THE DRAWINGS

The above and other objects, features and advantages of the disclosure will become more apparent to those of ordinary skill in the art by describing in detail exemplary embodiments thereof with reference to the accompanying drawings, in which.

DETAILED DESCRIPTION OF THE EMBODIMENTS

Figure 1A:
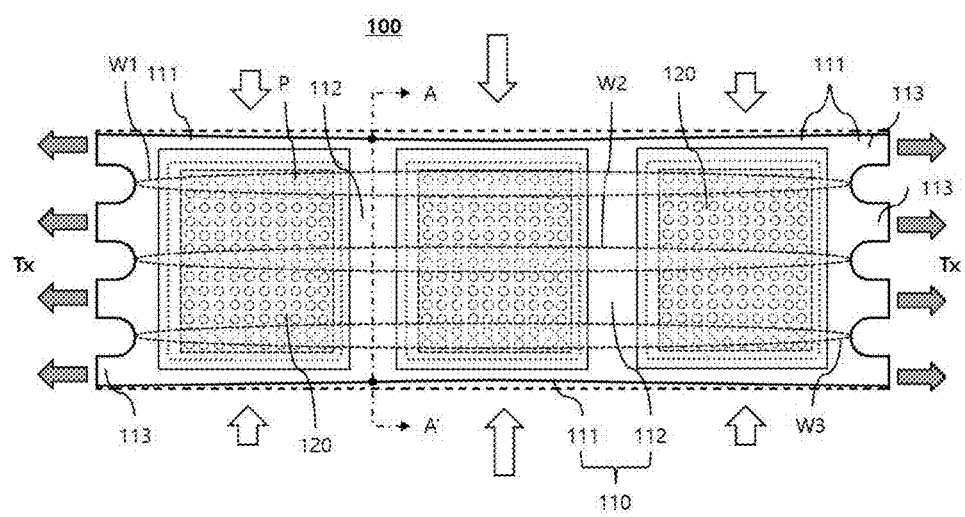
FIG. 1A is a schematic view of an upper surface of a deposition stick mask.
Figure 1B:
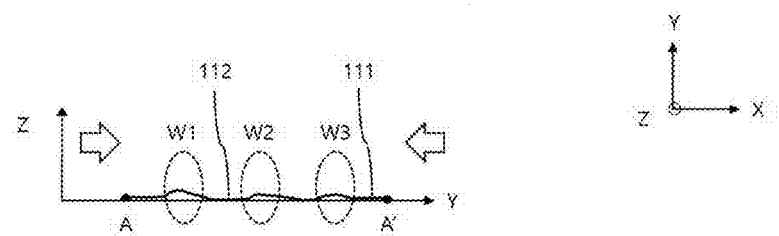
FIG. 1B is a schematic cross-sectional view taken along line A-A' of FIG. 1A.

Hereinafter, embodiments of the disclosure will be described in detail with reference to the appended drawings so that the disclosure may be easily understood and implemented by those of ordinary skill in the art. In describing the disclosure, well-known functions or configurations are omitted when it is determined that they would obscure the subject matter of the disclosure due to unnecessary detail. The terms used throughout the disclosure are defined in consideration of functions in embodiments of the disclosure but may be changed according to an intention of a user or an operator, precedents, etc. Therefore, the terms should be defined based on the overall context of the disclosure.

The above-described aspects and additional aspects of the disclosure s will be apparent from embodiments described below. Although components of alternative aspects or embodiments set forth herein are shown as individual single integrated configurations in the drawings, it should be understood that the components may be implemented in various combinations unless described otherwise or unless it is clear to those of ordinary skill in the art that there is a technically inconsistency.

Therefore, the embodiments described herein and the components shown in the drawings are merely examples of the disclosure and thus do not reflect all of the technical ideas of the disclosure, and it should be understood that there may be various equivalents that may replace the embodiments and modified examples at the time of filing the application.

Figure 2:
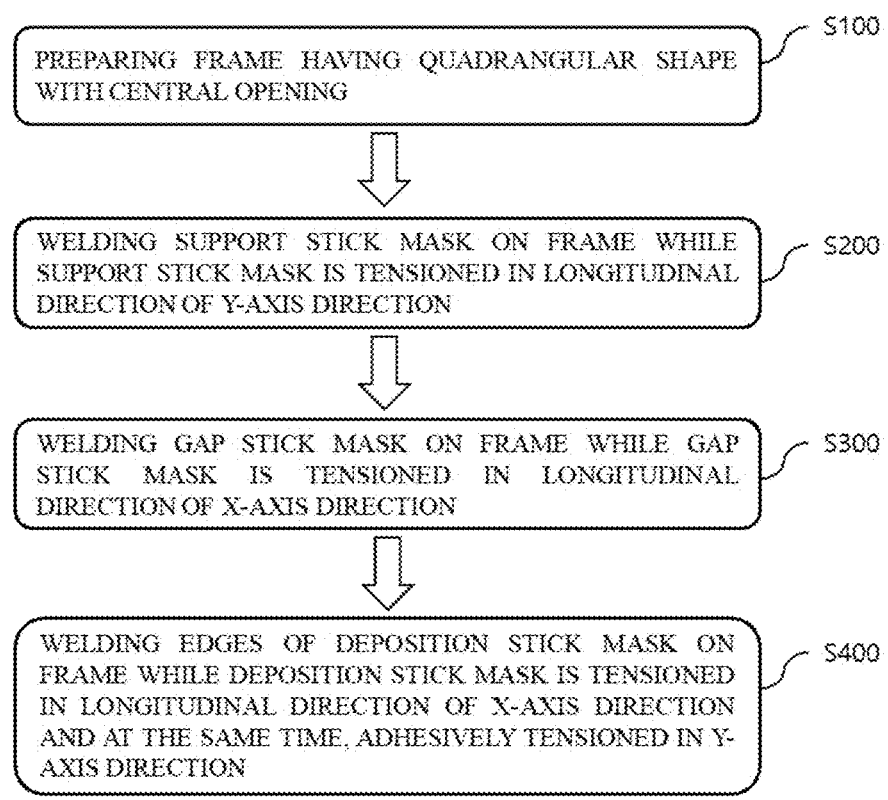
FIG. 2 is a diagram illustrating a method of manufacturing a deposition mask frame assembly according to an embodiment.

FIG. 2 is a diagram illustrating a method of manufacturing a deposition mask frame assembly according to an embodiment. As shown in FIG. 2, the method of manufacturing a deposition mask frame assembly using a deposition stick mask that includes a structural stick mask with edges and ribs and cell unit masks with deposition pattern holes may include the following operations. For example, the method of manufacturing the deposition mask frame assembly may include preparing a frame having a quadrangular shape with a central opening (S100), placing and welding a support stick mask on a frame while the support stick mask is tensioned in a longitudinal direction of a Y-axis direction (S200), placing and welding a gap stick mask on the frame while the gap stick mask is tensioned in a longitudinal direction of an X-axis direction (S300), and placing a deposition stick mask on the frame, and welding the edges of the deposition stick mask on the frame while the deposition stick mask is tensioned in a longitudinal direction of the X-axis direction and at the same time, adhesively tensioned in the Y-axis direction (S400).

Figure 3:
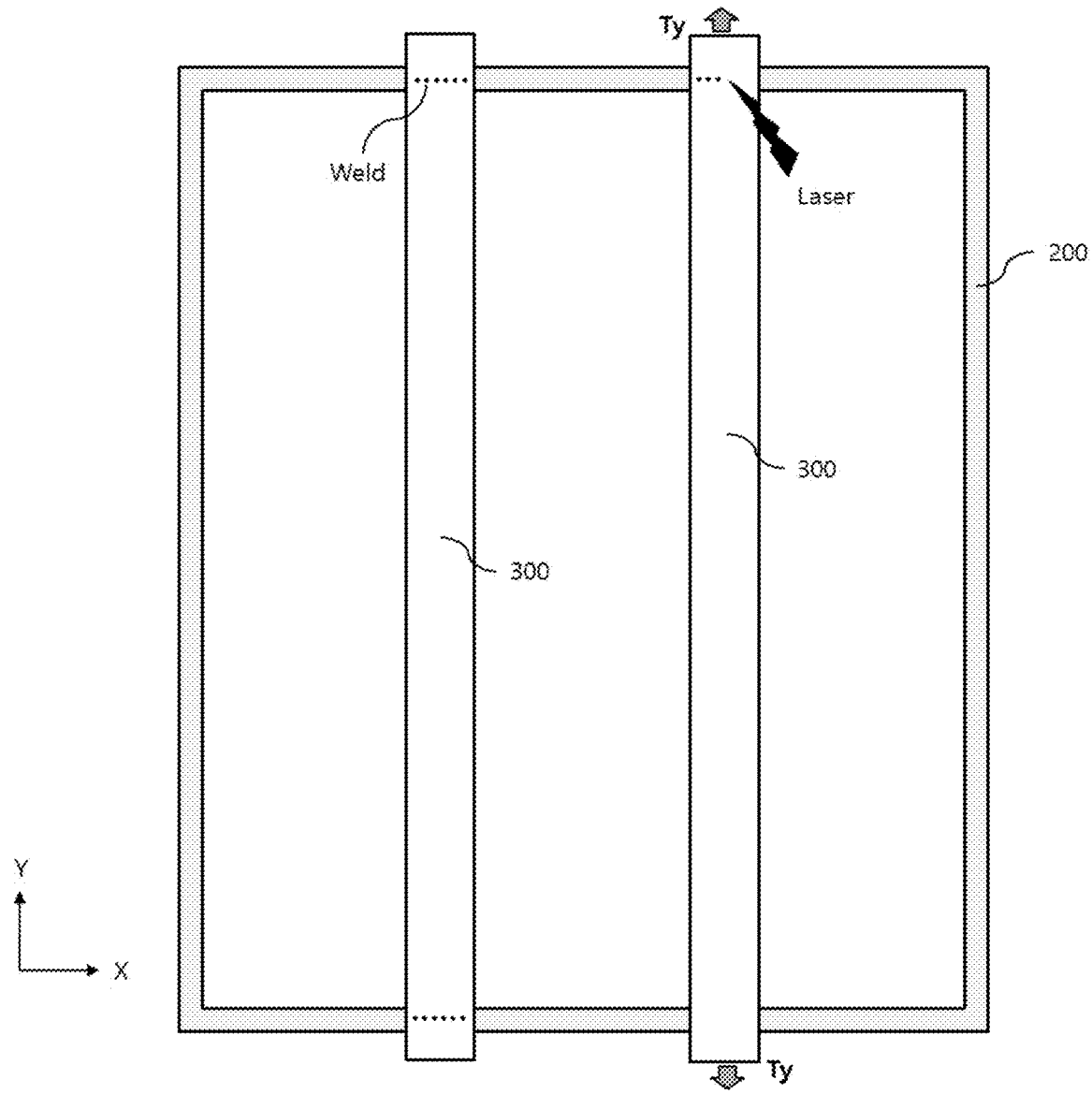
FIG. 3 is a schematic diagram for describing a method of welding a support stick mask on a frame according to an embodiment.

FIG. 3 is a schematic diagram for describing a method of welding a support stick mask on a frame according to an embodiment. As shown in FIG. 3, a frame 200 may be prepared. The frame 200 may have a quadrangular shape with a central opening. The frame 200 may have a rectangular shape consisting of longer sides and shorter sides. A support stick mask 300 may be placed and welded on the frame 200 while the support stick mask 300 is tensioned in a longitudinal direction of a Y-axis direction. At least two support stick masks 300 may be provided and welded on the shorter sides of the frame 200 while the support stick masks 300 are flattened by applying a tensile force Ty thereto. Each of the support stick masks 300 may support a stick mask located on another support stick mask 300 to prevent the stick mask from drooping. Welding may be optical welding, and especially, laser beam welding, and may be performed by emitting laser beams to an upper surface of the support stick mask 300.

Figure 4:
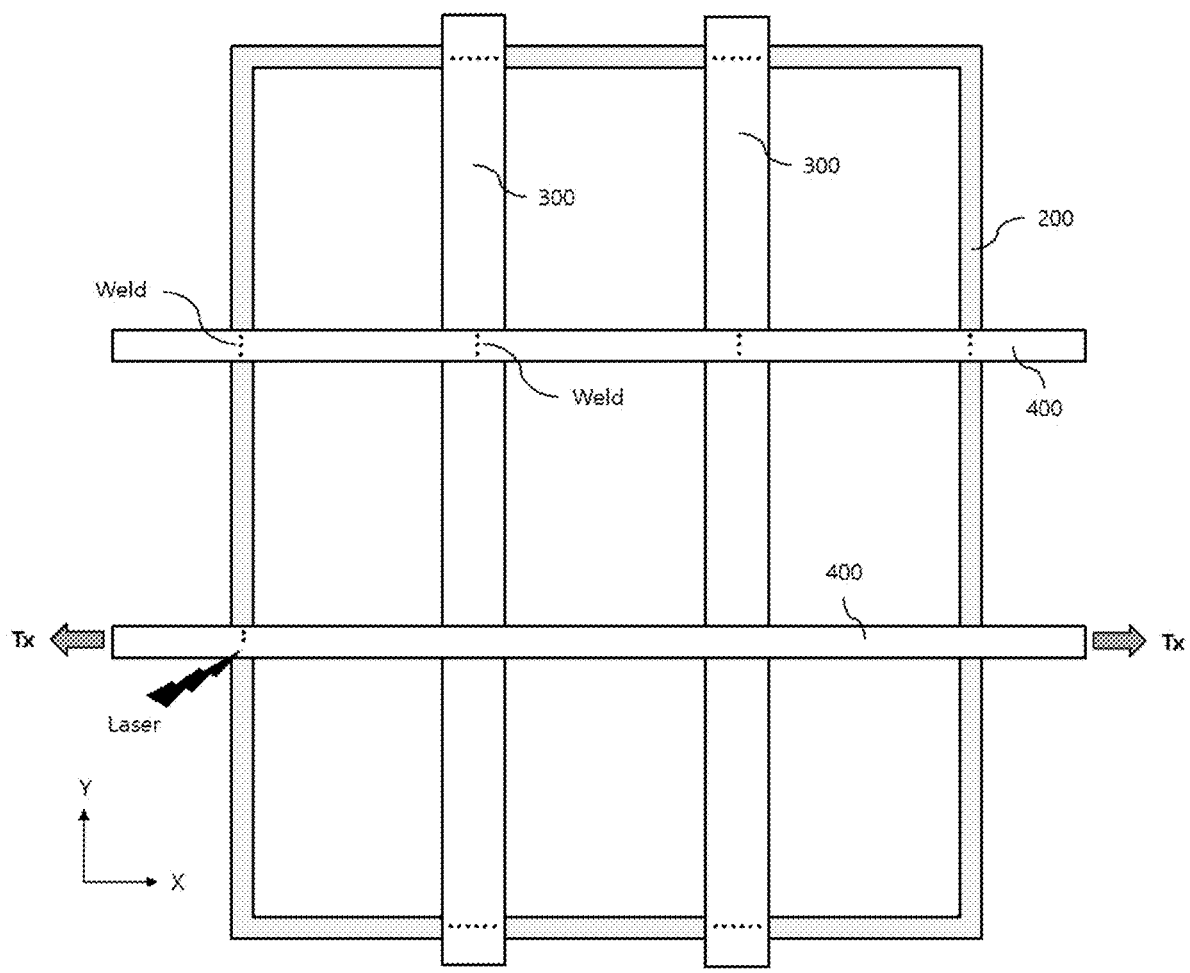
FIG. 4 is a schematic diagram for describing a method of welding a gap stick mask on a frame according to an embodiment.

FIG. 4 is a schematic diagram for describing a method of welding a gap stick mask on a frame according to an embodiment. As shown in FIG. 4, a gap stick mask 400 may be placed and welded on a frame 200 while the gap stick mask 400 is tensioned in a longitudinal direction of an X-axis direction. At least two gap stick masks 400 may be provided and welded on the longer sides of the frame 200 while the gap stick masks 400 are flattened by applying a tensile force Tx thereto. Welding may be performed by emitting laser to an upper surface of the gap stick mask 400.

A width of a gap stick mask may be less than that of a support stick mask and a length thereof may be less than that of the support stick mask. Each of the gap stick mask and the support stick mask may be provided with skirts, but the skirts may not be provided as shown and an end thereof may be gripped by one gripper. Each of the gap stick mask and the support stick mask may be tensioned using a gripper in opposite directions.

According to an embodiment, the method of manufacturing a deposition mask frame assembly may further include fixing the gap stick mask 400 on the support stick mask 300 by welding overlapping regions of the support stick mask 300 and the gap stick mask 400. Therefore, the gap stick mask 400 may be maintained in close contact with the support stick mask 300.

Figure 5:
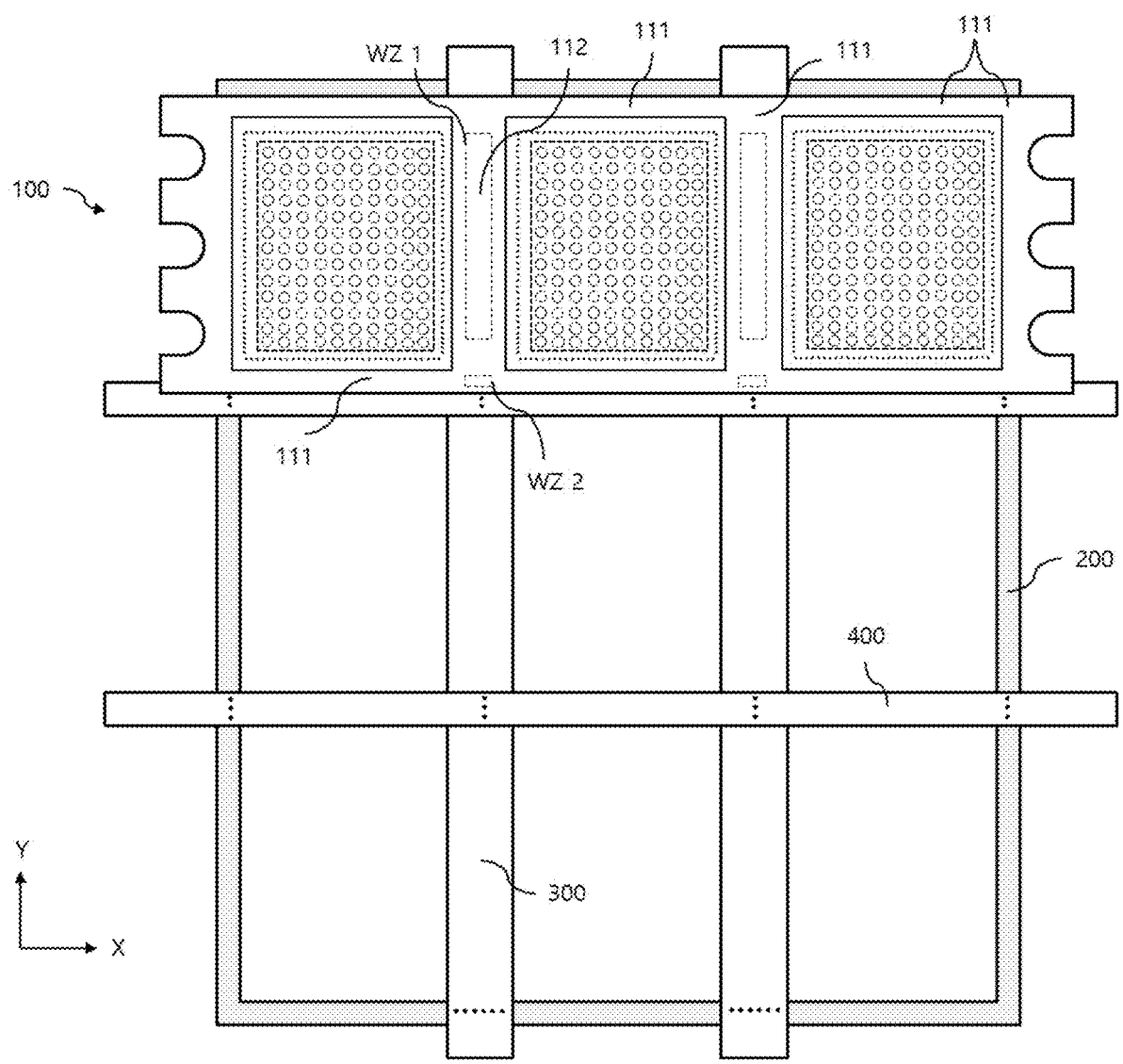
FIG. 5 is a schematic diagram for describing a method of providing a deposition stick mask on a frame according to an embodiment.

FIG. 5 is a schematic diagram for describing a method of providing a deposition stick mask on a frame according to an embodiment. As shown in FIG. 5, a deposition stick mask 100 may be placed on a frame 200. The deposition stick mask 100 may be disposed such that ribs 112 are located on a support stick mask 300 in an X-axis direction and edges 111 may be located on the frame 200 or the gap stick mask 400 in the Y-axis direction. Both a region WZ 1 in which the rib 112 and the support stick mask 300 overlap each other and a region WZ 2 in which the support stick mask 300, the gap stick mask 400 and the edge 111 overlap one another may be formed at the same time. The regions WZ 1 and WZ 2 may function as welding zones.

As shown in FIG. 5, the gap stick mask 400 may be disposed on or below the deposition stick mask 100. To dispose the gap stick mask 400 below the deposition stick mask 100, the gap stick mask 400 may be welded after the welding of the deposition stick mask 100.

Figure 6A:
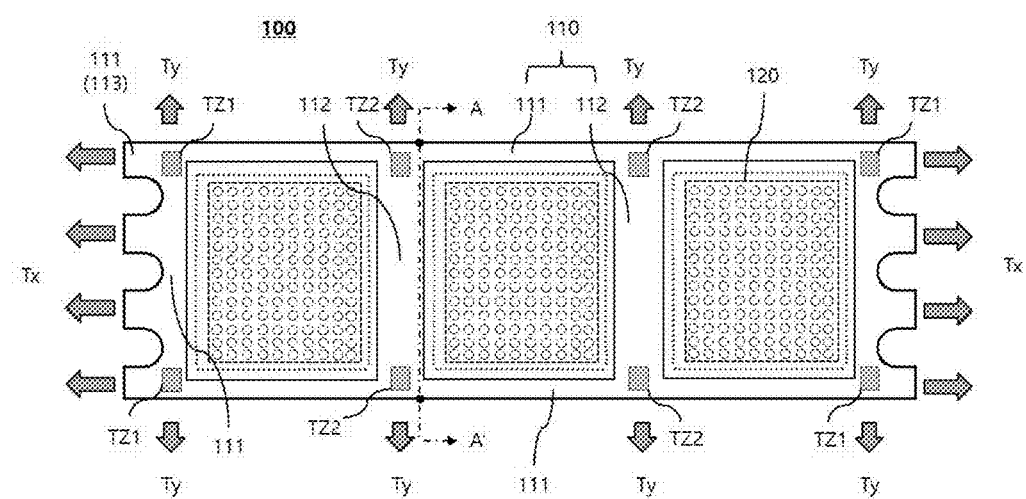
FIG. 6A is a schematic view of an upper surface of a tensioned deposition stick mask.
Figure 6B:
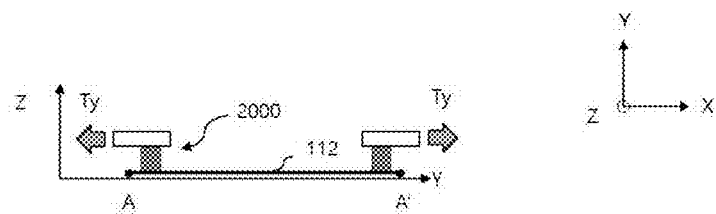
FIG. 6B is a schematic cross-sectional view taken along line A-A' of FIG. 6A.

FIG. 6A is a schematic view of an upper surface of a tensioned deposition stick mask, and FIG. 6B is a schematic cross-sectional view taken along line A-A' of FIG. 6A.

As shown in FIG. 6A, a tensile force Tx may be applied on the deposition stick mask in a longitudinal direction of an X-axis direction while an adhesive tensile force Ty is applied in the Y-axis direction. Ty may be preferably less than Tx (Ty<Tx).

Adhesive tensioning may be performed in the Y-axis direction while an edge region TZ1, which is a corner region of the deposition stick mask, and an edge region TZ2 adjacent to a rib are adhered. Accordingly, as shown in FIG. 6B, a shape and position of a pattern hole in a cell unit mask may be maintained without causing wrinkles of the ribs 112 vulnerable to wrinkling.

The adhesive tensioning may be performed by a vacuum method or an electrostatic method. Accordingly, skirts need not be additionally formed on the edges 111 and tensioning may be not performed using a gripper, thus preventing damage to a deposition stick mask. An adhesive tensioning device 2000 may be additionally employed for adhesive tensioning.

The edge 111 may include skirts 113. The skirts 113 may be regions to be gripped by grippers and may be not an essential component.

Figure 7A:
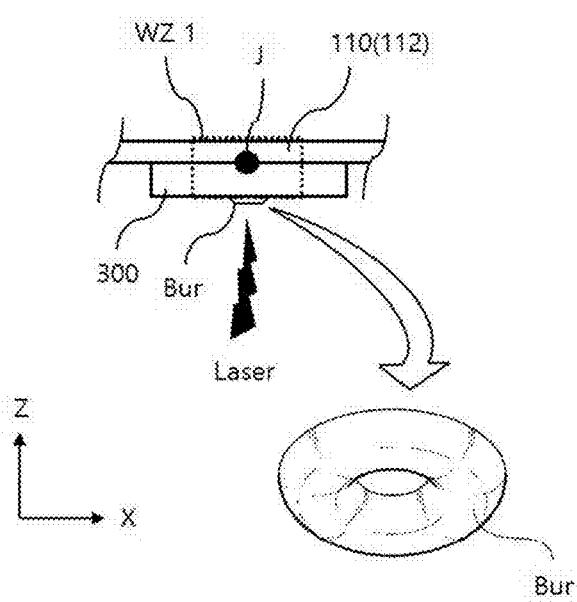
FIG. 7A is a schematic diagram for describing a method of welding overlapping regions WZ 1 of a deposition stick mask and a support stick mask.
Figure 7B:
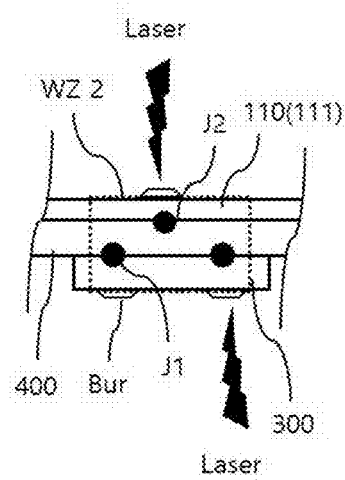
FIG. 7B is a schematic diagram for describing a method of welding overlapping regions WZ 2 of the deposition stick mask, the gap stick mask, and the support stick mask.

FIG. 7A is a schematic diagram for describing a method of welding overlapping regions WZ 1 of a deposition stick mask 100 and a support stick mask 300, and FIG. 7B is a schematic diagram for describing a method of welding overlapping regions WZ 2 of the deposition stick mask 100, the gap stick mask 400, and the support stick mask 300.

As shown in FIG. 7A, the method of manufacturing a deposition mask frame assembly may further include fixing the deposition stick mask 100 on the support stick mask 300 by disposing the ribs 112 of the deposition stick mask 100 on the support stick mask 300 and welding overlapping regions WZ 1 (as indicated by a dotted line) of the ribs 112 and the support stick mask 300. The ribs 112 and the support stick mask 300 may be fused at a junction J and fixed to each other.

Furthermore, the overlapping regions WZ 1 of the ribs 112 and the support stick mask 300 may be welded by emitting laser to a lower surface of the support stick mask 300. Therefore, burrs (protrusions due to welding) may be generated on the lower surface of the support stick mask 300.

As shown in FIG. 7B, the method of manufacturing a deposition mask frame assembly may further include disposing some regions of the edges 111 on the gap stick mask 400 and welding overlapping regions WZ 2 (as indicated by a dotted line) of the support stick mask 300, the gap stick mask 400, and the edges 111 of the deposition stick mask 100. The welding may be welding using laser, and laser may be emitted to the lower surface of the support stick mask 300 to join the gap stick mask 400 and the support stick mask 300 at a junction J1 and emitted to an upper surface of the deposition stick mask 100 to fuse and join gap stick mask 400 and the deposition stick mask 100 at a junction J2. Therefore, burrs may be generated on the upper surface of the deposition stick mask 100 and the lower surface of the support stick mask 300. The upper surface of the deposition stick mask 100 may come into close contact with TFT glass during a deposition process.

Figure 8:
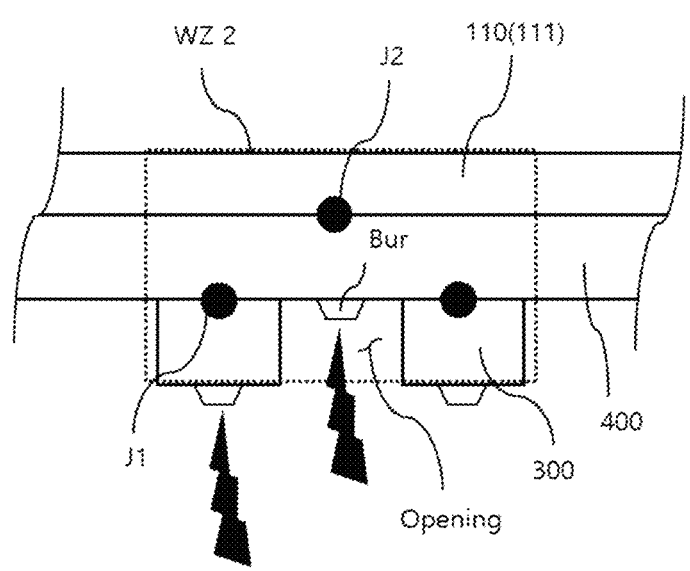
FIG. 8 is a schematic diagram illustrating a method of welding overlapping regions of a deposition stick mask, a gap stick mask, and a support stick mask according to another embodiment.

FIG. 8 is a schematic diagram illustrating a method of welding overlapping regions of a deposition stick mask, a gap stick mask, and a support stick mask according to another embodiment. FIG. 8 illustrates an embodiment for improving the problem of the embodiment of FIG. 7B in that burrs are prevented from being generated on an upper surface of a deposition stick mask.

In a method of manufacturing a deposition mask frame assembly, a support stick mask may be provided with openings, and laser may be emitted to an opening in a lower surface of the support stick mask and a region of the support stick mask excluding the opening so as to weld overlapping regions WZ 2 of the support stick mask, a gap stick mask, and edges of a deposition stick mask. Thus, burrs may be generated on lower surfaces of the support stick mask and the gap stick mask to prevent gaps from occurring when TFT glass and a hybrid stick mask are brought into close contact with each other in a deposition process, so that the TFT glass and the hybrid stick mask may be in tight contact with each other, thereby reducing a shadow effect.

According to an embodiment, the lower surface of the support stick mask may be lifted to a certain height using a bar to weld overlapping regions of the deposition stick mask, the gap stick mask, and the support stick mask. Accordingly, the deposition stick mask, the gap stick mask, and the support stick mask may temporarily come into close contact with one another to be closely welded together.

Figure 9:
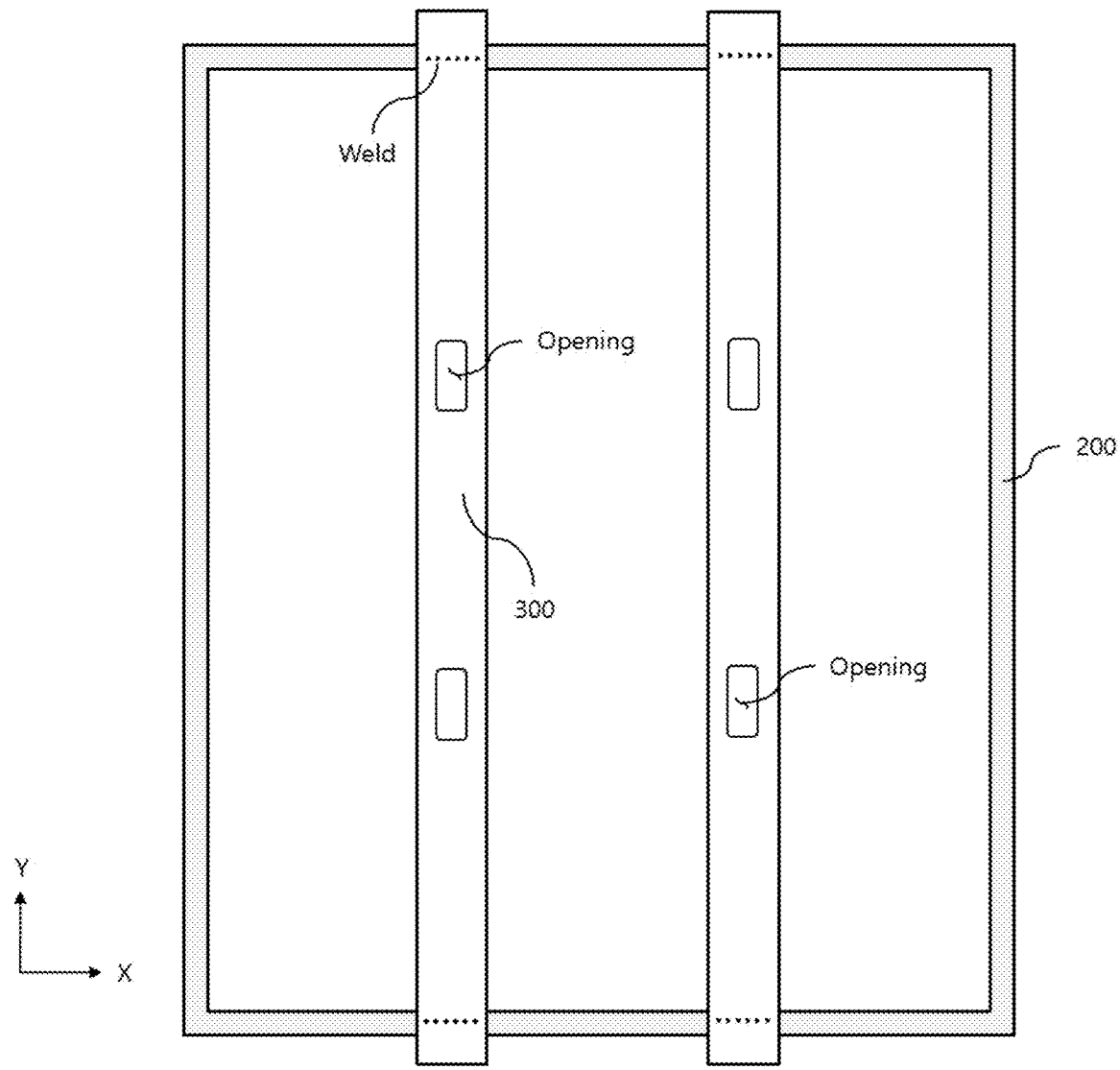
FIG. 9 is a schematic diagram for describing an opening in the support stick mask according to the embodiment of FIG. 8.

FIG. 9 is a schematic diagram for describing an opening in a support stick mask according to the embodiment of FIG. 8. As shown in FIG. 9, a support stick mask 300 may be provided with an opening. The embodiment of FIG. 8 may be implemented using the opening. Openings may be provided in overlapping regions WZ 2 of a support stick mask, a gap stick mask, and edges of a deposition stick mask.

Figure 10:
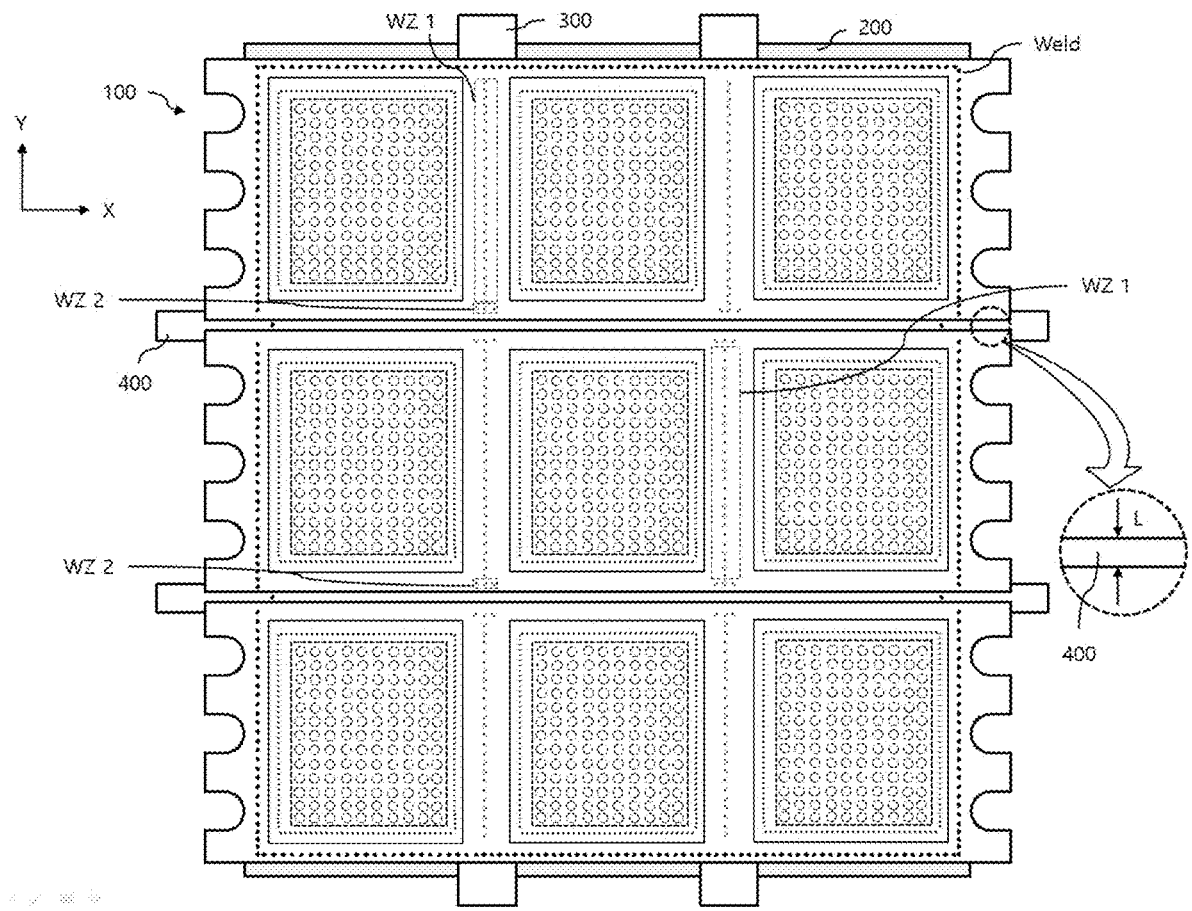
FIG. 10 is a schematic view of a deposition mask frame assembly after welding is completed.

FIG. 10 is a schematic view of a deposition mask frame assembly after welding is completed. As shown in FIG. 10, a support stick mask 300, a gap stick mask 400, and a deposition stick mask 100 may be welded together according to the embodiments of FIGS. 4, 7A, 8, thereby manufacturing an assembly in which stick masks and a frame may be integrally formed. Overlapping regions WZ 1 (as indicated by a dotted line) of ribs and the support stick mask 300 may be welded together according to the embodiment of FIG. 7A, and overlapping regions WZ 2 (as indicated by a dotted line) of the support stick mask 300, the gap stick mask 400, and edges 111 of the deposition stick mask 100 may be welded together according to the embodiment of FIG. 8.

Deposition stick masks 100 may be welded together to be separated by a clearance having a length L, thereby avoiding interference therebetween. Leaking of an organic material through the clearance during a deposition process may be prevented by the gap stick mask 400.

Figure 11:
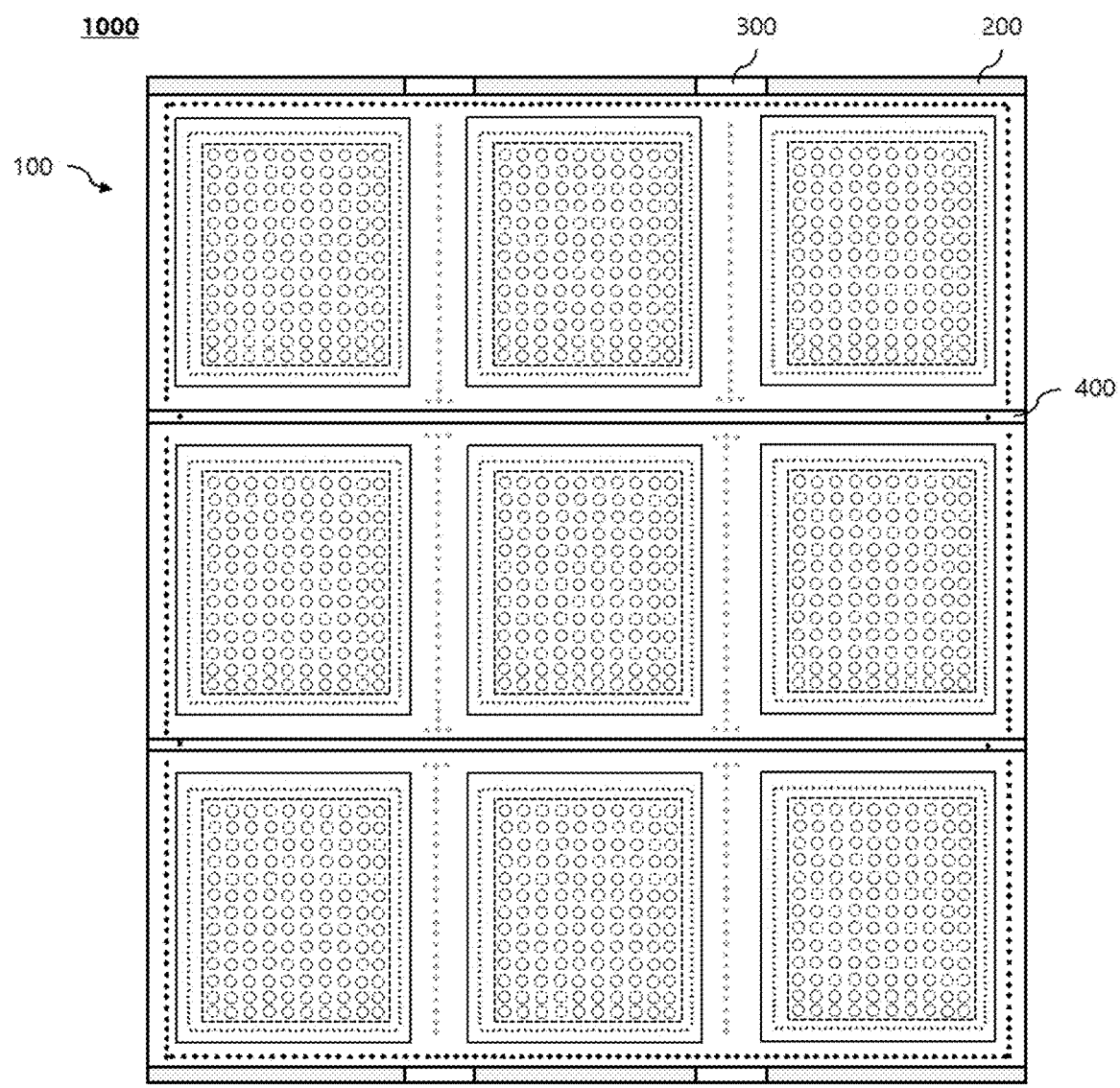
FIG. 11 is a schematic view of a trimmed deposition mask frame assembly.

FIG. 11 is a schematic view of a trimmed deposition mask frame assembly. As shown in FIG. 11, a method of manufacturing a deposition mask frame assembly 1000 may further include cutting or trimming portions of a support stick mask 300, a gap stick mask 400, and a deposition stick mask 100 that protrude from a frame 200. The deposition mask frame assembly 1000 may be completed by cutting.

To perform a deposition process using the deposition mask frame assembly 1000, TFT glass (not shown) may be brought into close contact with a central opening in the frame 200 and an organic material source may be placed below the deposition mask frame assembly 1000.

Figure 12:
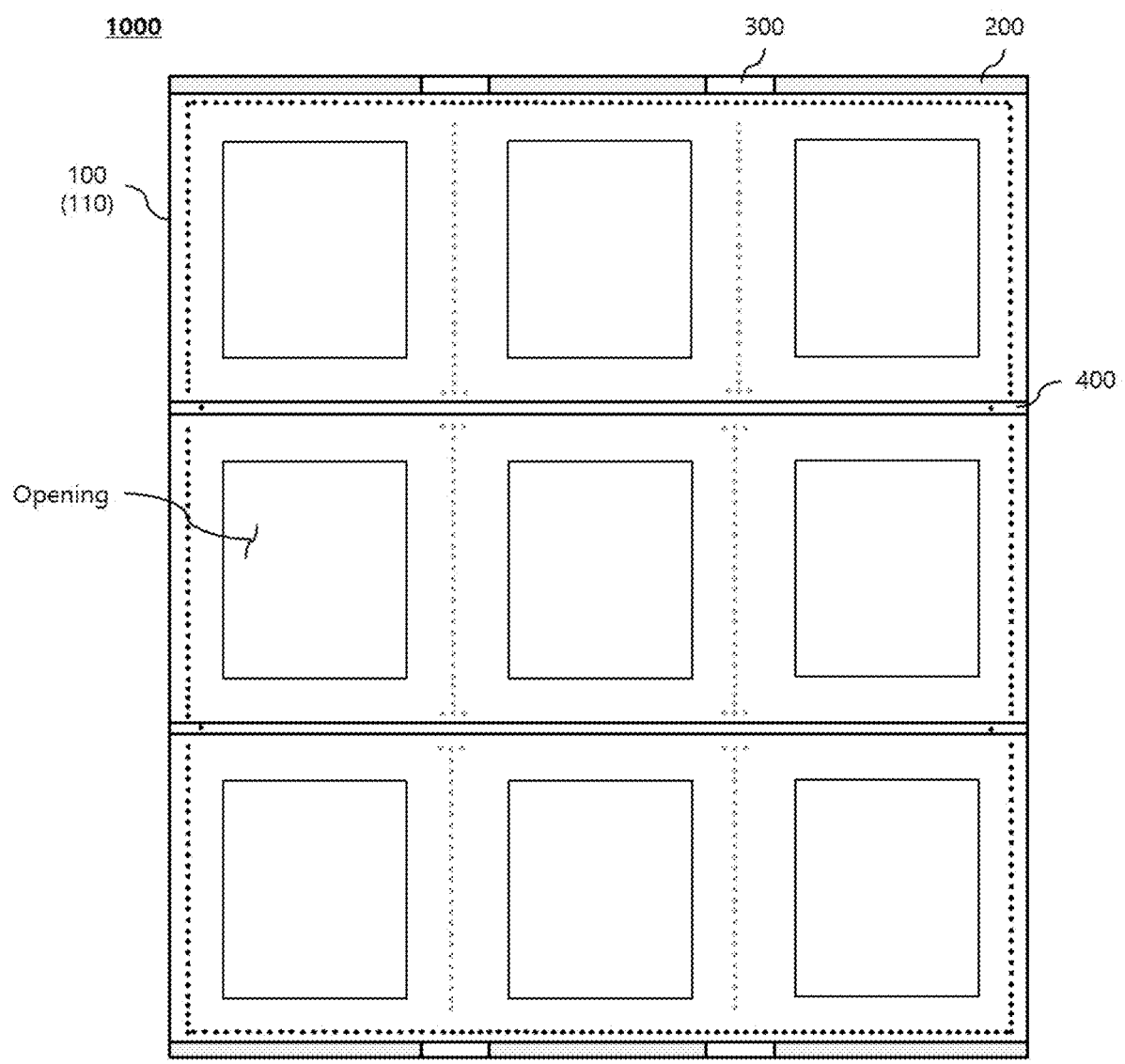
FIG. 12 is a schematic view of the deposition mask frame assembly of FIG. 11 to which a cell unit mask is not attached.
Figure 13:
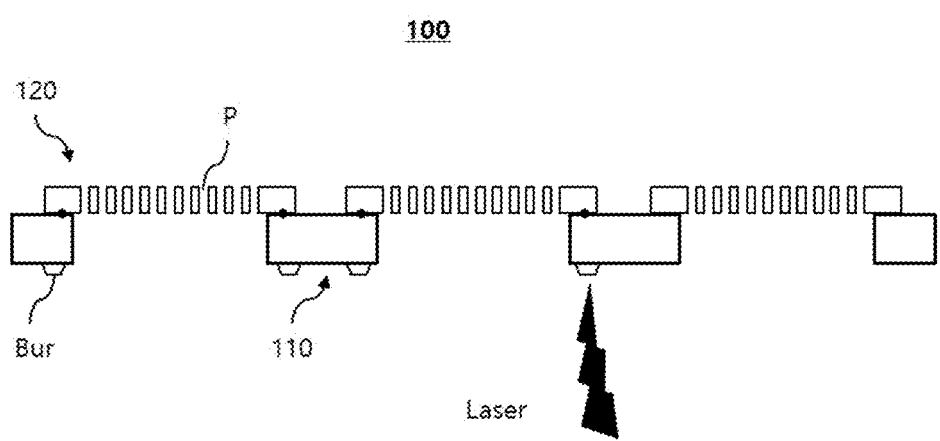
FIG. 13 is a schematic diagram for describing a method of welding a cell unit mask on a structural stick mask of FIG. 12.

FIG. 12 is a schematic view of the deposition mask frame assembly of FIG. 11 to which a cell unit mask is not attached. FIG. 13 is a schematic diagram for describing a method of welding a cell unit mask 120 on a structural stick mask 110.

As shown in FIG. 12, in a method of manufacturing a deposition mask frame assembly according to an embodiment, a deposition mask frame assembly may be manufactured using a structural stick mask 110, to which a cell unit mask is not attached, by the method described above with reference to FIGS. 5 to 10 after the processes of FIGS. 3 and 4 is performed. The structural stick mask 110 may be provided with an opening.

Next, as shown in FIG. 13, cell unit masks 120 may be placed and fixed on the structural stick mask 110 (particularly, in the opening) by laser welding. Therefore, an assembly process of the cell unit masks 120 may be a lower-priority process and thus a position variation of a deposition pattern hole P during the manufacture of deposition mask frame assembly may be minimized. The deposition mask frame assembly of FIG. 11 may be completed by the above-described process.

According to an embodiment, welding may be performed by emitting laser to a "lower surface" of the structural stick mask 110. Thus, burrs may be generated on the lower surface of the structural stick mask 100 to prevent gaps from occurring when TFT glass and a hybrid stick mask may be brought into close contact with each other during a deposition process, so that the TFT glass and the hybrid stick mask may be in tight contact with each other, thereby reducing the shadow effect.

According to the disclosure, a fine and high-quality deposition mask frame assembly can be manufactured by preventing wrinkles due to tensioning of a medium or large deposition stick masks.

A deposition mask frame assembly can be manufactured using a support stick mask and a gap stick mask to stably fix deposition masks and cover a gap between the deposition masks.

Because skirts need not be formed on the deposition stick mask, damage to the deposition stick mask can be prevented.

In addition, it is possible to prevent TFT glass and a cell unit mask from being lifted or a gap from occurring therebetween by performing laser welding on lower surfaces thereof.

What is claimed is:

1. A method of manufacturing a deposition mask frame assembly using a deposition stick mask that includes a structural stick mask with edges and ribs and cell unit masks with deposition pattern holes, the method comprising:
    preparing a frame having a quadrangular shape with a central opening;
    placing and welding a support stick mask on a frame while the support stick mask is tensioned in a longitudinal direction of a Y-axis direction;
    placing and welding a gap stick mask on the frame while the gap stick mask is tensioned in a longitudinal direction of an X-axis direction; and
    placing the deposition stick mask on the frame, and welding the edges on the frame while the deposition stick mask is tensioned in a longitudinal direction of the X-axis direction and at the same time, adhesively tensioned in the Y-axis direction,
    wherein the gap stick mask is fixed on the support stick mask by welding overlapping regions of the gap stick mask and the support stick mask, and
    the ribs are located on the support stick mask and the edges are located on the frame or the gap stick mask, and both of which function as welding zones.

2. The method of claim 1, further comprising welding overlapping regions of the support stick mask, the gap stick mask and the edges by disposing the deposition stick mask to locate some regions of the edges on the gap stick mask.

3. The method of claim 1, wherein the overlapping regions of the ribs and the support stick mask are welded together by emitting laser to a lower surface of the support stick mask.

4. The method of claim 2, wherein the support stick mask is provided with openings, and
    the support stick mask, the gap stick mask, and the edges of the deposition stick mask are welded together by emitting laser to an opening of the openings in a lower surface of the support stick mask and a region of the support stick mask excluding the opening.

5. A deposition mask frame assembly manufactured by the method of claim 1.

6. An organic light-emitting diode display device manufactured using the deposition mask frame assembly of claim 5.

* * * * *